US008976576B2

(12) United States Patent
Chen et al.

(10) Patent No.: US 8,976,576 B2
(45) Date of Patent: Mar. 10, 2015

(54) STATIC RANDOM ACCESS MEMORY STRUCTURES

(71) Applicant: Semiconductor Manufacturing International (Shanghai) Corporation, Shanghai (CN)

(72) Inventors: Jinming Chen, Shanghai (CN); Stella Huang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/057,294

(22) Filed: Oct. 18, 2013

(65) Prior Publication Data
US 2014/0347917 A1 Nov. 27, 2014

(30) Foreign Application Priority Data
May 21, 2013 (CN) .......................... 2013 1 0190614

(51) Int. Cl.
| G11C 11/412 | (2006.01) |
| G11C 11/419 | (2006.01) |
| G11C 5/06 | (2006.01) |
| G11C 8/16 | (2006.01) |
| G11C 5/02 | (2006.01) |
| G11C 7/12 | (2006.01) |

(52) U.S. Cl.
CPC ................ *G11C 8/16* (2013.01); *G11C 11/419* (2013.01); *G11C 11/412* (2013.01); *G11C 5/06* (2013.01); *G11C 7/12* (2013.01)

USPC ............... 365/156; 365/154; 365/72; 365/51; 365/63; 365/189.011

(58) Field of Classification Search
CPC ...... G11C 11/412; G11C 11/419; G11C 7/12; G11C 5/06; G11C 8/16
USPC .............................. 365/154, 155, 156, 230.05
See application file for complete search history.

(56) References Cited

U.S. PATENT DOCUMENTS

| 5,774,393 | A | * | 6/1998 | Kuriyama | ...................... 365/156 |
| 7,920,409 | B1 | * | 4/2011 | Clark et al. | .................... 365/154 |
| 8,654,575 | B2 | * | 2/2014 | Deng | .............................. 365/156 |
| 2010/0254210 | A1 | * | 10/2010 | Liaw | ........................ 365/230.05 |
| 2011/0075504 | A1 | * | 3/2011 | Chan et al. | ............... 365/230.05 |
| 2011/0317477 | A1 | * | 12/2011 | Liaw | ............................ 365/156 |

* cited by examiner

*Primary Examiner* — Ly D Pham
(74) *Attorney, Agent, or Firm* — Anova Law Group, PLLC

(57) ABSTRACT

A static random access memory structure is provided. The static random access memory structure includes a storage region having a first storage node and a second storage node which is complementary to the first storage node. The static random access memory structure also includes a reading region having a first reading transfer gate and a second reading transfer gate, and a reading word line electrically connecting with the gate of the first reading transfer gate and the gate of the second reading transfer gate. Further, the static random access memory structure includes a writing region independent of the reading region having a first writing transfer gate and a second writing transfer gate and a writing word line electrically connecting with the gate of the first writing transfer gate and the gate of the second transfer gate.

19 Claims, 5 Drawing Sheets

US 8,976,576 B2

STATIC RANDOM ACCESS MEMORY STRUCTURES

CROSS-REFERENCES TO RELATED APPLICATIONS

This application claims the priority of Chinese patent application No. 201310190614.6, filed on May 21, 2013, the entirety of which is incorporated herein by reference.

FIELD OF THE INVENTION

The present invention generally relates to the field of semiconductor technology and, more particularly, relates to static random access memory structures.

BACKGROUND

In applications of large scale integrations (LSIs), static random access memories (SRAMs) are the widely-used on-chip memories. Unlike dynamic random access memories (DRAMs), an SRAM only needs to be powered to store data, and does not necessarily need to be refreshed. Therefore, SRAMs may have advantages including high speed and low power consumption, etc.

FIG. 1 illustrates a circuit structure of an existing SRAM, which may have six transistors (6T SRAM). As shown in FIG. 1, the 6T SRAM may include a first pull-up PMOS transistor PU1, a second pull-up PMOS transistor PU2, a first pull-down NMOS transistor PD1 and a second pull-down NMOS transistor PD2. Sources of the first pull-up PMOS transistor PU1 and the second pull-up PMOS transistor PU2 may connect with a power source $V_{dd}$. Sources of the first pull-down NMOS transistor PD1 and the second pull-down NMOS transistor PD2 may connect with a ground Vss. The first pull-up PMOS transistor PU1 and the first pull-down NMOS transistor PD1 may form a first inverter. The second pull-up PMOS transistor PU2 and the second pull-down NMOS transistor PD2 may form a second inverter. The output of the first inverter may electrically connect with the input of the second inverter, and a first storage node Q may be formed. The input of the second inverter may electrically connect with the output of the first inverter, and a second storage node QN may be formed.

Because the first inverter and the second inverter may have a cross-coupling effect, a latch circuit may be formed. When one storage node is pulled down to a lower potential, the other storage node may be pulled up to a higher potential. The first storage node Q may connect with a first transfer gate TG1. The second storage node QN may connect with a second transfer gate TG2. The first transfer gate TG1 and the second transfer gate TG2 may connect with a first word line WL1.

When the first word line WL1 is switched to a system high potential, the first transfer gate TG1 and the second transfer gate TG2 may be turned on, and a first bit line BL1 and a second bit line BL2 may be allowed to write data into the first storage node Q and the second storage node QN, or to read data from the first storage node Q and the second storage node QN. When the first word line WL1 is switched to a system low potential, the first transfer gate TG1 and the second transfer gate TG2 may be turned off, the first bit line BL1 and the second bit line BL2 may be isolated from the first storage node Q and the second storage node QN.

However, the existing 6T STRAM structure may perform a data reading and a data writing by the first transfer gate TG1 and the second transfer gate TG2, which may cause the existing 6T SRAM to perform only one operation of the data reading and the data writing in one time sequence, it may be impossible to perform a data reading and a data writing simultaneously. Thus, the 6T SRAM may have a relatively low data reading and writing speed.

Therefore, in order to increase the data reading and data writing speed, dual-port SRAMs have been developed. Referring to FIG. 1, the dual port SRAM may be formed by adding a third transfer gate TG3 and a fourth transfer gate TG4 to the existing 6T SRAM, an 8T SRAM may be formed. The third transfer gate TG3 and the fourth transfer gate TG4 may connect with the first storage node Q and the second storage node QN. The third transfer gate TG3 and the fourth transfer gate TG4 may also connect with a second word line WL2.

When the second word line WL2 is switched to a system high potential, the third transfer gate TG3 and the fourth transfer gate TG4 may be turned on, and the third transfer gate TG3 and the fourth transfer gate TG4 may be used to read data from the first storage node Q and the second storage node QN, or write date to the first storage node Q and the second storage node QN by a third bit line BL3 and a fourth bit line BL4. When the second word line WL2 is switched to a system low potential, the third transfer gate TG3 and the fourth transfer gate TG4 may be turned off, the third bit line BL3 and the fourth bit line BL4 may be isolated from the first storage node Q and the second storage node QN. After adding the third transfer gate TG3 and the fourth transfer gate TG4, the dual-port SRAM may perform a data reading and a data writing by the first word line WL1 and the second word line WL2 simultaneously, the data reading and writing rate of the SRAM may be significantly increased.

However, the data writing and data reading of existing dual-port SRAMs may be unstable. The disclosed device structures and systems are directed to solve one or more problems set forth above and other problems.

BRIEF SUMMARY OF THE DISCLOSURE

The present disclosure includes a static random access memory structure. The static random access memory structure includes a storage region having a first storage node and a second storage node which is complementary to the first storage node. The static random access memory structure also includes a reading region having a first reading transfer gate and a second reading transfer gate, and a reading word line electrically connecting with the gate of the first reading transfer gate and the gate of the second reading transfer gate. Further, the static random access memory structure includes a writing region independent of the reading region having a first writing transfer gate and a second writing transfer gate, and a writing word line electrically connecting with the gate of the first writing transfer gate and the gate of the second writing transfer gate.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
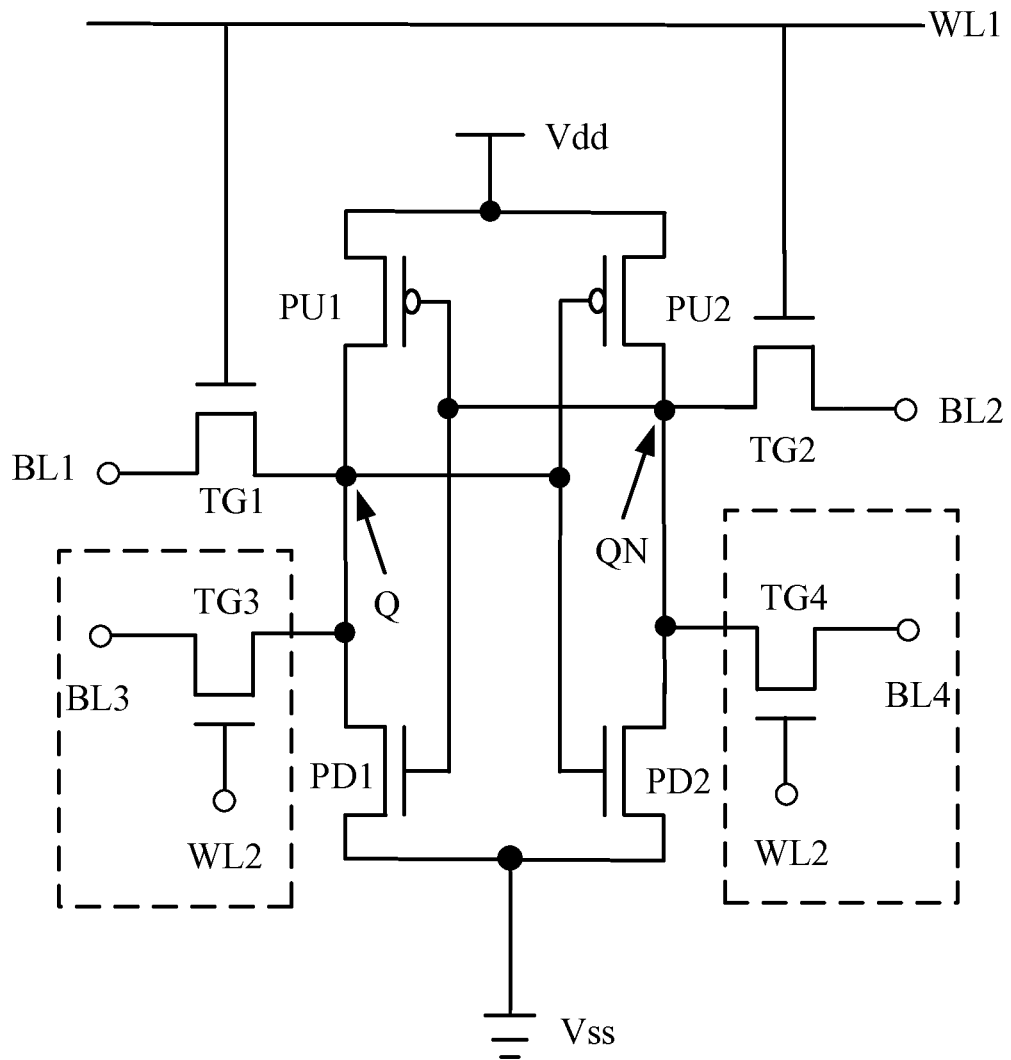
FIG. 1 illustrates an existing circuit structure of an existing static random access memory.

Referring to FIG. 1, it is found that structures of the first transfer gate TG1, the second transfer gate TG2, the third transfer gate TG3 and the fourth transfer gate TG4 may be same. It may be random to chose the first word line WL1 or the second word line WL2 to perform a data reading and a data writing, which may cause certain layout disadvantages.

Figure 2:
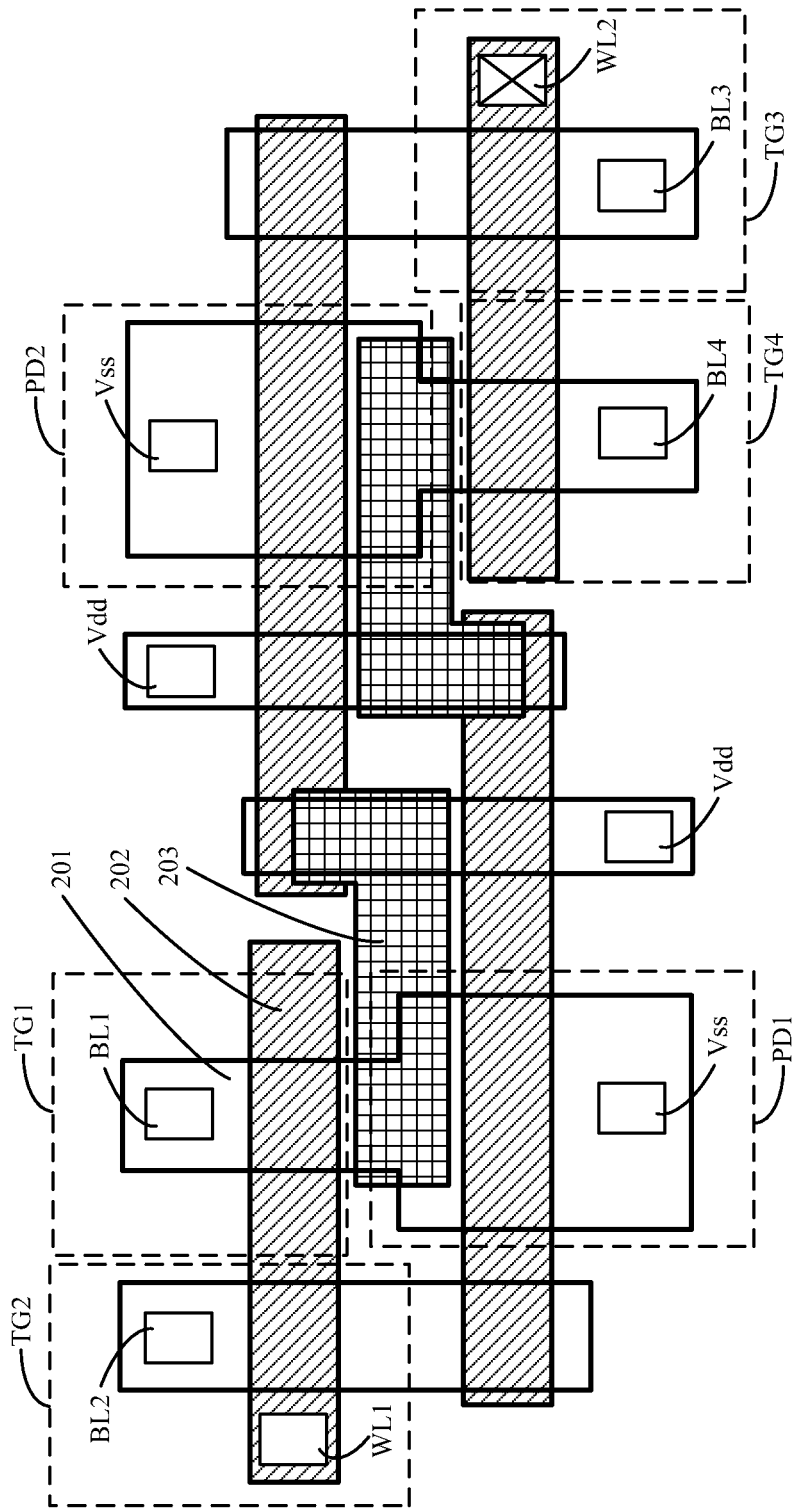
FIG. 2 illustrates a layout-design of the existing static random access memory.

FIG. 2 illustrates a layout-design of the existing eight-transistor static random access memory (8T SRAM) shown in FIG. 1. Only the layout design of one active region 201, one gate 202 and one metal layer 203 of the 8T SRAM may be presented in FIG. 2.

As shown in FIG. 2, the first word line WL1 may connect with the gates 202 of the first transfer gate TG1 and the second transfer gate TG2. Although the structures the first transfer gate TG1 and the second transfer gate TG2 may be same, the external environment of the first transfer gate TG1 and the second transfer gate TG2 may be different. Thus, electrical properties of the first transfer gate TG1 and the second transfer gate TG2 may mismatch. Similarly, electrical properties of the third transfer gate TG3 and the fourth transfer gate TG4 may also mismatch.

Further, the data writing ability of an SRAM may be determined by a γ ratio, where $\gamma \propto I_{TG}/I_{PU}$. That is, the y ratio may be proportional to the drive current ($I_{TG}$) of a transfer gate transistor, and inversely proportional to the drive current ($I_{PU}$) of a pull-up transistor. The data reading stability of a SRAM may be determined by a â ratio, where $\hat{a} \propto I_{PD}/I_{PG}$. The â ratio may be proportional to the drive current ($I_{PD}$) of a pull-down transistor, and inversely proportional to the drive current ($I_{TG}$) of a transfer gate transistor. For the existing 8T SRAM, the first word line WL1 or the second word line WL2 may be randomly chosen to perform a data writing or a date reading, and the four transfer gate transistors (TG1, TG2, TG3 and TG4) may be same. Thus, it may be unable to guarantee to obtain a relatively high γ ratio and a relatively high â ratio simultaneously. Thus, the data writing and reading stability of the existing dual-port 8T SRAM may be undesired.

Further, as shown in FIG. 2, the first transfer gate TG1 and the pull-down transistor PD1 of the existing dual port SRAM may be formed in one active region. In order to obtain a relatively large static noise margin (SNM), a width of the channel region of the first pull-down transistor PD1 may be relatively big, while width of the first transfer gate TG1, width of the second transfer gate TG2, width of the third transfer gate TG3 and width of the fourth transfer gate TG4 may be same.

In one embodiment, the width of the channel region of the first pull-down transistor PD1 may be approximately 2~4 times of the width of the channel region of the first transfer gate TG1. The width difference of the channel regions of the first pull-down transistor PD1 and the first transfer gate TG1 may cause shapes of the active regions of the first pull-down transistor PD1 and the first transfer gate PG1 to be irregular.

Thus, photolithography processes for forming the dual-port 8T SRAM may have a corner rounding effect, and it may be difficult to control the accuracy of the width of the channel regions. Thus, electrical parameters of the first transfer gate TG1 may be unable to match electrical parameters of the second transfer gate TG2. That is, the matching abilities of the first transfer gate TG1 and the second transmission TG2 may decrease. Thus, it may cause the data reading and writing rate of the dual-port 8T SRAM to decrease, and cause the power consumption to increase. It may also cause the dual-port 8T SRAM to have a clock chaos problem. Similarly, the second pull-down transistor PD2 and the third transfer gate TG3 may have same problems as the first pull-down transistor PD1 and the first transfer gate TG1. The disclosed embodiments overcome such problems by, for example, isolating data reading regions and data writing regions, and isolating data reading transistors and data writing transistors.

Figure 3:
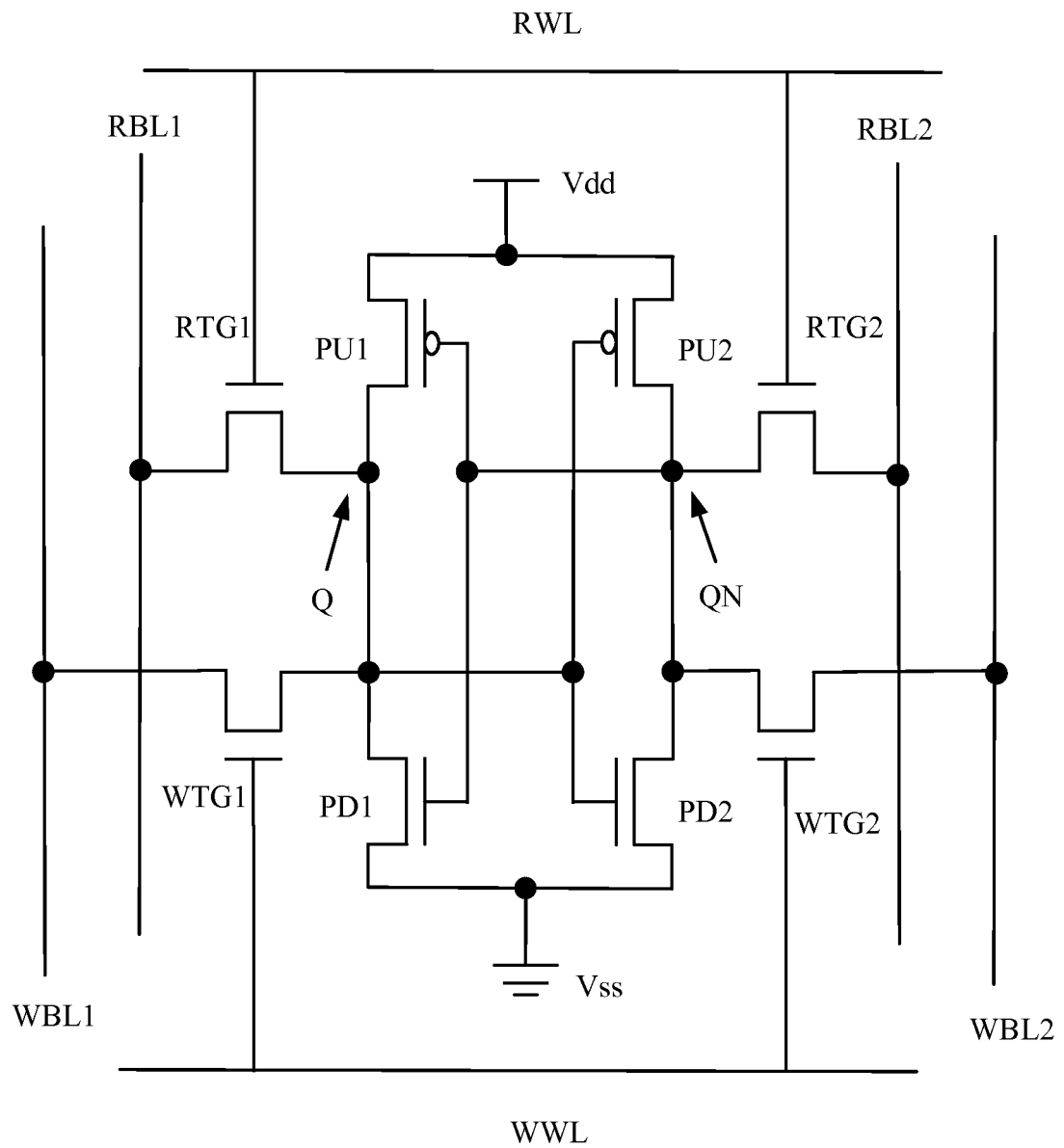
FIG. 3 illustrates the circuit structure of a static random access memory consistent with the disclosed embodiments.

FIG. 3 illustrates the circuit structure of a static random access memory consistent with the disclosed embodiments.

The static random access memory (SRAM) may have a storage region, a data reading region and a data writing region. In one embodiment, the storage region may have a first inverter and a second inverter.

Referring to FIG. 3, the first inverter may include a first pull-up PMOS transistor PU1 and a first pull-down NMOS transistor PD1. The source region of the first pull-up PMOS transistor PU1 may connect with a power source $V_{dd}$. The source region of the first pull-down NMOS transistor PD1 may connect with a ground $V_{ss}$. The gate of the first pull-up PMOS transistor PU1 may connect with the gate of the first pull-down NMOS transistor PD1 to form an input of the first inverter. The drain region of the first pull-up PMOS transistor PU1 may connect with the drain region of the first pull-down NMOS transistor PD1 to form an output of the first inverter.

The second inverter may include a second pull-up PMOS transistor PU2 and a second pull-down NMOS transistor PD2. The source region of the second pull-up PMOS transistor PU2 may connect with the power source $V_{dd}$. The source region of the second pull-down NMOS transistor PD2 may connect with the ground $V_{ss}$. The gate of the second pull-up PMOS transistor PU2 may connect with the gate of the second pull-down NMOS transistor PD2 to form an input of the second inverter. The drain region of the second pull-up PMOS transistor PU2 may connect with the drain region of the second pull-down NMOS transistor PD2 to form an output of the second inverter.

Further, as shown in FIG. 3, the output of the first inverter may connect with the input of the second inverter to form a first storage node Q of the storage region. The input of the first inverter may connect with the output of the second inverter to form a second storage node QN which is complementary to the first storage node Q of the storage region.

The first inverter and the second inverter may have a cross-coupling effect; a latch circuit may be formed. The latch circuit may be used to store data. When any one of the first storage node Q and the second storage node QN is pulled down to a low potential, the other may be pulled up to a high potential, thus the potential of the first storage node Q and the potential of the second storage node QN may be complimentary to each other.

Referring to FIG. 3, the reading region may have a first reading transfer gate RTG1 and a second reading transfer gate RTG2. The gate of the first reading transfer gate RTG1 and the gate of the second reading transfer gate RTG2 may electrically connect with a reading word line RWL. The source region and the drain region of the first reading transfer gate RTG 1 may electrically connect with a first reading bit line RBL1 and the first storage node Q, respectively. The source region and the drain region of the second reading transfer gate RTG2 may electrically connect with a second reading bit line RBL2 and the second storage node QN, respectively.

In one embodiment, the first reading transfer gate RTG1 and the second reading transfer gate RTG2 are both NMOS transistors. PMOS transistors may also be used. When a voltage of the reading word line RWL is switched to a system high voltage, for example, the voltage of the power source $V_{dd}$, the first reading transfer gate RTG1 and the second reading transfer gate RTG2 may be turned on, the first data storage node Q and the second data storage node QN may be accessed through the first reading bit line RBL1 and the second reading bit line RBL2, respectively, complementary voltage information may be read.

When the voltage of the reading word line RWL is switched to a system low voltage, for example, the voltage of the ground $V_{ss}$, the first reading transfer gate RTG1 and the second reading transfer gate RTG2 may be turned off, the first reading bit line RBL1 and the second reading bit line RBL2 may be isolated from the first data storage node Q and the second data storage node QN.

Referring to FIG. 3, the writing region may have a first writing transfer gate WTG1 and a second writing transfer gate WTG2. The gate of the first writing transfer gate WTG1 and the gate of the second writing transfer gate WTG2 may electrically connect with a writing word line WWL. The source region and the drain region of the first writing transfer gate WTG1 may electrically connect with a first writing bit line WBL1 and the first storage node Q, respectively. The source region and the drain region of the second writing transfer gate WTG2 may connect with a second writing bit line WBL2 and the second storage node QN, respectively.

In one embodiment, the first writing transfer gate WTG1 and the second reading transfer gate WTG2 are both NMOS transistors. PMOS transistors may also be used. When a voltage of the writing word line WWL is switched to a system high voltage, for example, the voltage of the power source $V_{dd}$, the first writing transfer gate WTG1 and the second writing transfer gate WTG2 may be turned on, the first data storage node Q and the second data storage node QN may be accessed through the first writing bit line WBL1 and the second writing bit line WBL2, respectively, complementary voltage information may be written.

When the voltage of the writing word line WWL is switched to a system low voltage, for example, the voltage of the ground $V_{ss}$, the first writing transfer gate WTG1 and the second writing transfer gate WTG2 may be turned off, the first writing bit line WBL1 and the second writing bit line WBL2 may be isolated from the first data storage node Q and the second data storage node QN.

In one embodiment, the reading region and the writing region may be isolated, a structure of the first writing transfer gates WTG1 and a structure of the second writing transfer gate WTG2 may be independent of the first reading transfer gate RTG1 and the second reading transfer gate RTG2. A ratio of a drive current ($I_{WTG}$) of the writing transfer gate (WTG1 or WTG2) and a drive current ($I_{PU}$) of the pull-up PMOS transistor (PU1 or PU2) may be increased by adjusting a size of the first writing transfer gate WTG1 and a size of the second writing transfer gate WTG2, i.e., may be referred as a cell ratio. Thus, a relatively high ã ratio (ã∝$I_{PG}/I_{PU}$) may be obtained, and the writing ability may be increased.

At the same time, a ratio of a drive current ($I_{PD}$) of the pull-down NMOS transistor (PD1 or PD2) and a drive current ($I_{RTG}$) of the reading transfer gate (RTG1 or RTG2) may be increased by adjusting a size of the first reading transfer gate RTG1 and a size of the second reading transfer gate RTG2, i.e., may be referred as a cell ratio. Thus, a relatively high a ratio (â∝$I_{PD}/I_{RTG}$) may be obtained, and the reading stability may be increased.

Figure 4:
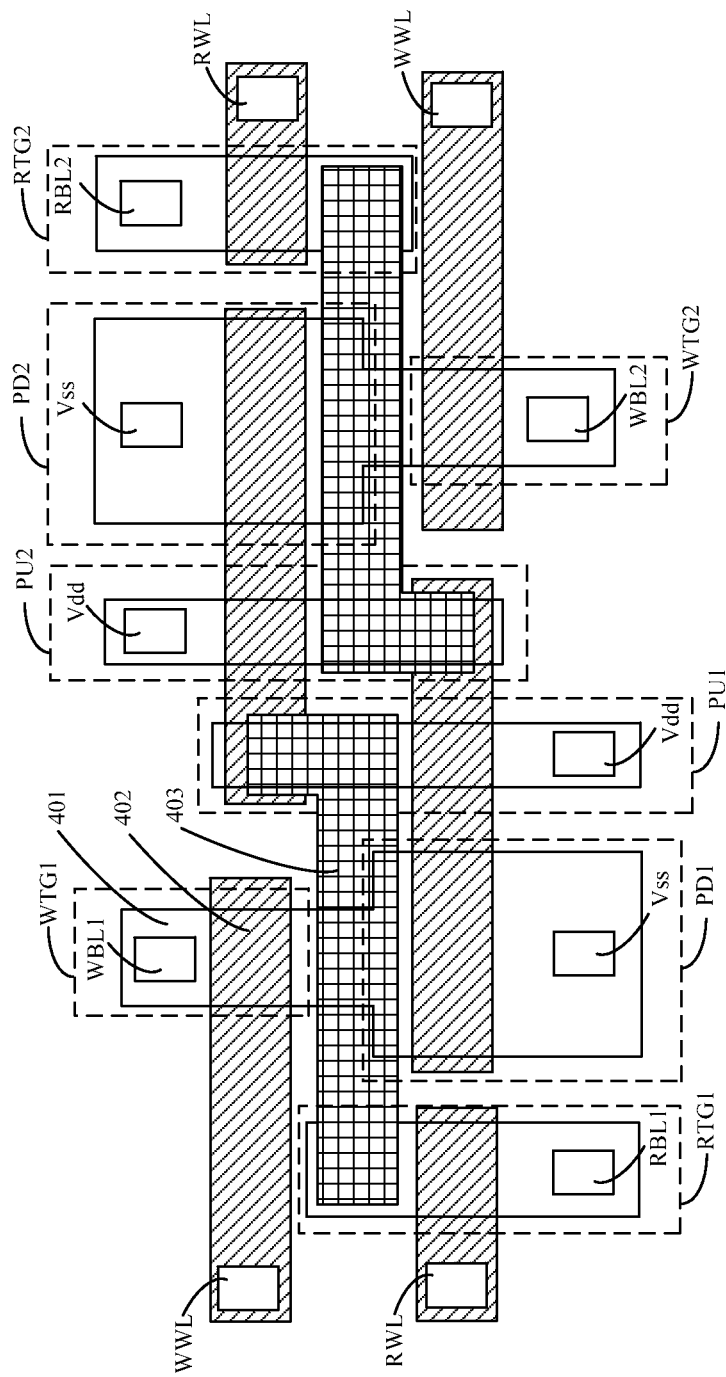
FIGS. 4-5 illustrate layout-designs of the static random access memory consistent with the disclosed embodiments.

FIG. 4 illustrates a layout-design of the static random access memory corresponding to FIG. 3. For illustrative purposes, only one active region 401, one gate 402, one metal layer 403 and their connection relationships are illustrated.

Referring to FIG. 4, in one embodiment, the first writing transfer gate WTG1, the second writing transfer gate WTG2, the first reading transfer gate RTG1 and the second reading transfer gate RTG2 may be NMOS transistors. Other type transistors may also be used. The first pull-up PMOS transistor PU1 may be in a first N-type active region. The second pull-up PMOS transistor PU2 may be in a second N-type active region. The first pull-down NMOS transistor PD1 and the first writing transfer gate WTG1 may be in a first P-type active region. The first reading transfer gate RTG1 may be in a second P-type active region. The second pull-down NMOS transistor PD2 and the second writing transfer gate WTG2 may be in a third P-type active region. The second reading transfer gate RTG2 may be in a fourth P-type active region.

Further, the first pull-down NMOS transistor PD1 and the first pull-up PMOS transistor PU1 may share a gate, and may connect with the drain region of the second pull-up transistor PU2. The second pull-down NMOS transistor PD2 and the second pull-up PMOS transistor PU2 may share a gate, and may connect with the drain region of the first pull-up PMOS transistor PU1.

Further, the source region or the drain region of the first reading transfer gate RTG1, the source region or the drain region of the first writing transfer gate WTG1, the drain region of the first pull-down NMOS transistor PD1, the drain region of the first pull-up PMOS transistor PU1 and the gate of the second pull-up PMOS transistor PU2 may be connected together by a metal layer. The source region or the drain region of the second reading transfer gate RTG2, the source region or the drain region of the reading transfer gate RTG2, the drain region of the second pull-down NMOS transistor PD2, the drain region of the second pull-up PMOS transistor PU2 and the gate of the first pull-up PMOS transistor PU1 may be connected together by a metal layer.

In one embodiment, a structure of the first reading transfer gate RTG1 and a structure of the second reading transfer gate RTG2 may be same, and the first reading transfer gate RTG1 and the second reading transfer gate RTG2 may be rotationally symmetric, thus external environments of the first transfer gate RTG1 and external environments of the second transfer gate RTG2 may be same, and electric properties of the first reading transfer gate RTG1 may match electric properties of the second reading transfer gate RTG2.

Further, a structure of the first writing transfer gate WTG1 and a structure the second writing transfer gate WTG2 may be same, and the first writing transfer gate WTG1 and the second writing transfer gate WTG2 may be rotationally symmetric as well, thus external environments of the first writing transfer gate WTG1 and external environments of the second writing transfer gate WTG2 may be same, and electric properties of the first writing transfer gate WTG1 may match properties of the second writing transfer gate WTG2. Therefore, the performance of the SRAM may be enhanced, and the risk of the mismatching may be reduced.

Further, because the first reading transfer gate RTG1 and the second reading transfer gate RTG2 may be independent of and the first writing transfer gate WTG1 and the second writing transfer gate WTG2, a size of the first reading transfer gate RTG1, a size of the second reading transfer gate nRTG2, a size of the first writing transfer gate WTG1 and a size of the second writing transfer gate WTG2 may be adjusted according to requirements of the reading stability and requirements of the writing ability of the SRAM. A structure of the first reading transfer gate RTG1, a structure of the second reading transfer gate RTG2, a structure of the first writing transfer gate WTG1 and a structure of the second writing transfer gate WTG2 may be adjusted to be same, and/or different, a high γ ratio and a high β ratio may be obtained simultaneously.

Figure 5:
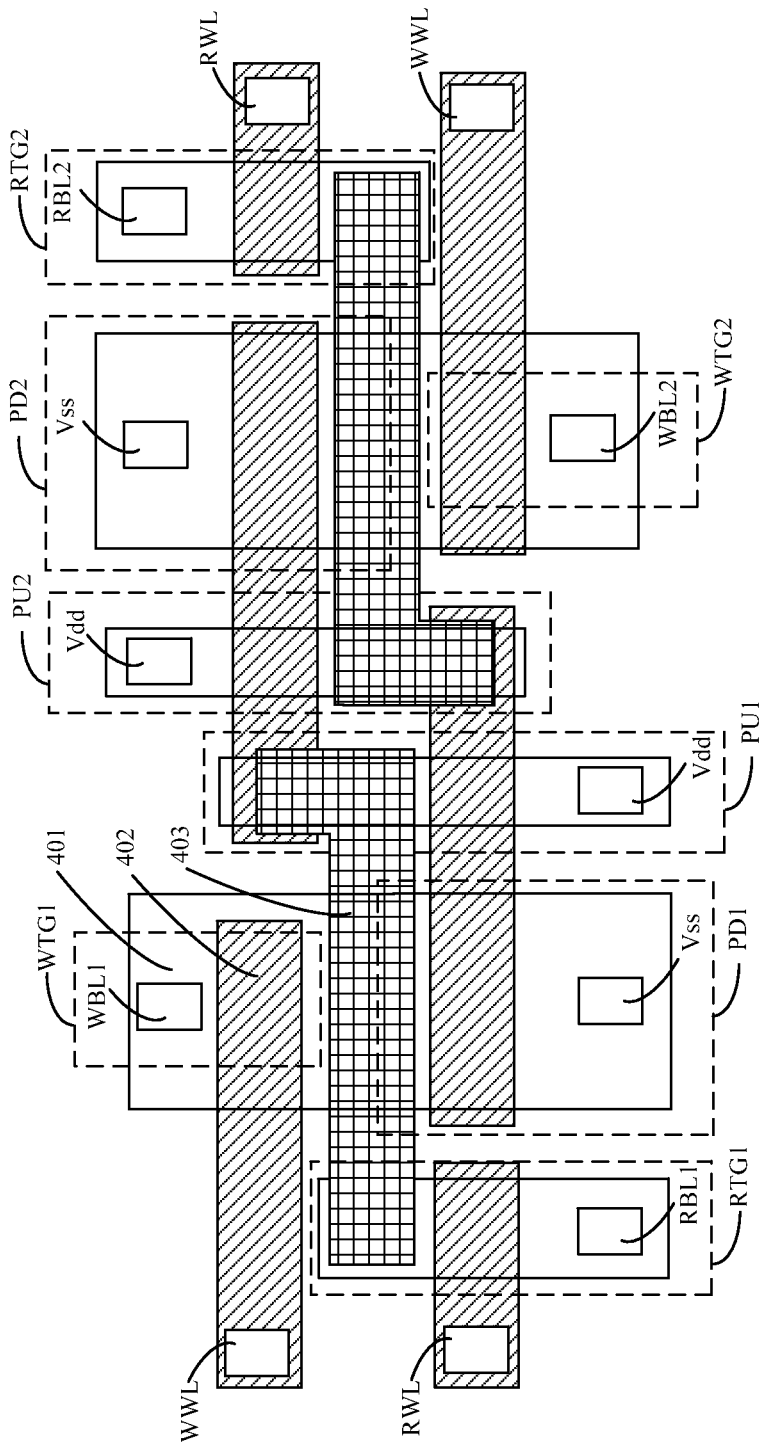

FIG. 5 illustrates a layout-design of another static random access memory corresponding to the FIG. 3. As shown in FIG. 5, major differences compared with FIG. 4 may be that a width of the first pull-down NMOS transistor PD1 and a width of the first writing transfer gate WTG1 may be same, and a width of the second pull-down NMOS transistor PD2 and a width of the second writing transfer gate WTG2 are same as well. Similarly, for illustrative purposes, only one active region 401, one gate 402 and one metal layer 403 are illustrated in FIG. 5.

Referring to FIG. 5, because the first pull-down NMOS transistor PD1 and the first writing transfer gate WTG1 may be in the first P-type active region, and the width of the channel region of the first pull-down NMOS transistor PD1 and the width of the channel region of the first writing transfer gate WTG1 may be same, the first P-type active region may be rectangular. It may be easier for a semiconductor process to obtain a rectangular shape than to obtain an irregular shape, and it may be easy to achieve an accurate control. Similarly, the second pull-down NMOS transistor PD2 and the second writing transfer gate WTG2 may be in the third P-type active region, and the width of the channel region of the second pull-down NMOS transistor PD2 and the width of the channel region of the second writing transfer gate WTG2 may be same, the third P-type active region may be rectangular. Thus, the process control of the third P-type active region may be easier.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A static random access memory structure, comprising:
   a storage region having a first storage node and a second storage node which is complementary to the first storage region;
   a reading region having a first reading transfer gate and a second reading transfer gate; and
   a writing region having a first writing transfer gate and a second writing transfer gate,
   wherein:
      a gate of the first reading transfer gate and a gate of the second reading transfer gate electrically connect with a reading word line;
      a gate of the first writing transfer gate and a gate of the second writing transfer gate electrically connect with a writing word line;
      the reading region and the writing region are separated;
      the first reading transfer gate and the second reading transfer gate are rotationally symmetric, and the first writing transfer gate and the second writing transfer gate are rotationally symmetric;
      the first reading transfer gate is configured to be isolated from the first writing transfer gate, and the second reading transfer gate is configured to be isolated from the second writing transfer gate;
      a size of the first reading transfer gate and a size of the second reading transfer gate are adjusted according to a ratio of a drive current of a pull-down NMOS transistor and a drive current of one of the first reading transfer gate and the second reading transfer gate; and
      a size of the first writing transfer gate and a size of the second writing transfer gate are adjusted according to a ratio of a drive current of one of the first writing transfer gate and the second reading transfer gate and a drive current of a pull-up PMOS transistor.

2. The static random access memory structure according to claim 1, wherein:
   a source region and a drain region of the first reading transfer gate electrically connect with a first reading bit line and the first storage node, respectively;
   a source region and a drain region of the second reading transfer gate electrically connect with a second reading bit line and the second storage node, respectively;
   a source region and a drain region of the first writing transfer gate electrically connect with a first writing bit line and the first storage node, respectively; and
   a source region and a drain region of the second writing transfer gate electrically connect with a second writing bit line and the second storage node, respectively.

3. The static random access memory structure according to claim 1, wherein:
   the writing word line is assigned to perform data writing; and
   the reading word line is assigned to perform data reading.

4. The static random access memory structure according to claim 1, wherein:
   a structure of the first reading transfer gate and a structure the second reading transfer gate are same.

5. The static random access memory structure according to claim 1, wherein:
   a structure of the first writing transfer gate and a structure of the second writing transfer gate are same.

6. The static random access memory structure according to claim 1, wherein:
   structures of the first reading transfer gate and the second reading transfer gate and structures of the first writing transfer gate and the second writing transfer gate are same.

7. The static random access memory structure according to claim 1, wherein:
   the first reading transfer gate, the second reading transfer gate, the first writing transfer gate and the second writing transmission are NMOS transistors.

8. The static random access memory structure according to claim 1, wherein:
   the storage region includes a first inverter and a second inverter;
   an output of the first inverter electrically connects with an input of the second inverter to form the first storage node; and
   an input of the first inverter electrically connects with an output of the second inverter to form the second storage node.

9. The static random access memory structure according to claim 8, wherein:
   the first inverter includes a first pull-up PMOS transistor and a first pull-down NMOS transistor; and the second inverter includes a second pull-up PMOS transistor and a second pull-down NMOS transistor.

10. The static random access memory structure according to claim 9, wherein:
a source region of the first pull-up PMOS transistor electrically connects with a power source;
a source region of the first pull-down NMOS transistor electrically connects with a ground;
a gate of the firs pull-up PMOS transistor electrically connects with a gate of the first pull-down NMOS transistor to form an input of the first inverter; and
a drain region of the first pull-up PMOS transistor electrically connects with a drain region of the first pull-down NMOS transistor to form an output of the second inverter.

11. The static random access memory structure according to claim 9, wherein:
a source region of the second pull-up PMOS transistor connects with a power source;
a source region of the second pull-down NMOS transistor connects with a ground;
a gate of the second pull-up PMOS transistor connects with a gate of the second pull-down NMOS transistor to form an input of the second inverter; and
a drain region of the second pull-up transistor connects with a drain region of the second pull-down NMOS transistor to form an output of the second inverter.

12. The static random access memory structure according to claim 10, wherein:
the first pull-up PMOS transistor is in a first N-type active region;
the first pull-down NMOS transistor and the first writing transfer gate are in a first P-type active region; and
the first reading transfer gate locates is in a second P-type active region.

13. The static random access memory structure according to claim 11, wherein:
the second pull-up PMOS transistor is in a second N-type active region;
the second pull-down NMOS transistor and the second writing transfer gate are in a third P-type active region; and
the second reading transfer gate is in a fourth P-type active region.

14. The static random access memory structure according to claim 12, wherein:
a width of the first pull-down NMOS transistor and width of the first writing transfer gate are same; and
the first P-type active region is a rectangular.

15. The static random access memory structure according to claim 12, wherein:
a width of the first pull-down NMOS transistor and a width of the first writing transfer gate are different.

16. The static random access memory structure according to claim 13, wherein:
a width of the second pull-down NMOS transistor and a width of the second writing transfer gate are same; and
the third P-type active region is rectangular.

17. The static random access memory structure according to claim 1, wherein:
a cell ratio of the first reading transfer gate and the second reading transfer gate and a cell ratio of the first writing transfer gate and the second writing transfer gate are independent.

18. A static random access memory structure, comprising:
a storage region having a first storage node and a second storage node which is complementary to the first storage region;
a reading region having a first reading transfer gate and a second reading transfer gate; and
a writing region having a first writing transfer gate and a second writing transfer gate,
wherein:
the storage region further includes a first inverter, including a first pull-up PMOS transistor and a first pull-down NMOS transistor, and a second inverter, including a second pull-up PMOS transistor and a second pull-down NMOS transistor,
an output of the first inverter electrically connects with an input of the second inverter to form the first storage node, and an input of the first inverter electrically connects with an output of the second inverter to form the second storage node,
a source region of the first pull-up PMOS transistor electrically connects with a power source, a source region of the first pull-down NMOS transistor electrically connects with a ground, a gate of the firs pull-up PMOS transistor electrically connects with a gate of the first pull-down NMOS transistor to form an input of the first inverter, and a drain region of the first pull-up PMOS transistor electrically connects with a drain region of the first pull-down NMOS transistor to form an output of the second inverter,
a gate of the first reading transfer gate and a gate of the second reading transfer gate electrically connect with a reading word line, a gate of the first writing transfer gate and a gate of the second writing transfer gate electrically connect with a writing word line, the reading region and the writing region are separated, and the first reading transfer gate and the second reading transfer gate are independent of the first writing transfer gate and the second writing transfer gate,
the first pull-up PMOS transistor is in a first N-type active region, the first pull-down NMOS transistor and the first writing transfer gate are in a first P-type active region, and the first reading transfer gate locates is in a second P-type active region, and
a width of the first pull-down NMOS transistor and a width of the first writing transfer gate are different.

19. A static random access memory structure, comprising:
a storage region having a first storage node and a second storage node which is complementary to the first storage region;
a reading region having a first reading transfer gate and a second reading transfer gate; and
a writing region having a first writing transfer gate and a second writing transfer gate,
wherein:
the storage region further includes a first inverter, including a first pull-up PMOS transistor and a first pull-down NMOS transistor, and a second inverter, including a second pull-up PMOS transistor and a second pull-down NMOS transistor,
an output of the first inverter electrically connects with an input of the second inverter to form the first storage node, and an input of the first inverter electrically connects with an output of the second inverter to form the second storage node,
a source region of the second pull-up PMOS transistor connects with a power source, a source region of the second pull-down NMOS transistor connects with a ground, a gate of the second pull-up PMOS transistor connects with a gate of the second pull-down NMOS transistor to form an input of the second inverter, and a drain region of the second pull-up transistor connects with a drain region of the second pull-down NMOS transistor to form an output of the second inverter, a gate of the first reading transfer gate and a gate of the second reading transfer gate electrically connect with a reading word line, a gate of the first writing transfer gate and a gate of the second writing transfer gate electrically connect with a writing word line, and the reading region and the writing region are separated, and the first reading transfer gate and the second reading transfer gate are independent of the first writing transfer gate and the second writing transfer gate, the second pull-up PMOS transistor is in a second N-type active region, the second pull-down NMOS transistor and the second writing transfer gate are in a third P-type active region, and the second reading transfer gate is in a fourth P-type active region, and a width of the second pull-down NMOS transistor and a width of the second writing transfer gate are different.

\* \* \* \* \*